(12) United States Patent
Yoon et al.

(10) Patent No.: US 6,589,801 B1
(45) Date of Patent: Jul. 8, 2003

(54) WAFER-SCALE PRODUCTION OF CHIP-SCALE SEMICONDUCTOR PACKAGES USING WAFER MAPPING TECHNIQUES

(75) Inventors: Ju-Hoon Yoon, Seoul (KR); Dae-Byung Kang, Seoul (KR); In-Bae Park, Seoul (KR); Vincent DiCaprio, Mesa, AZ (US); Markus K. Liebhard, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/385,694

(22) Filed: Aug. 30, 1999

(30) Foreign Application Priority Data

| Aug. 31, 1998 | (KR) | 98-35620 |
| Aug. 31, 1998 | (KR) | 98-35622 |
| Aug. 31, 1998 | (KR) | 98-35623 |
| Aug. 31, 1998 | (KR) | 98-35624 |

(51) Int. Cl.⁷ .......... H01L 21/66; H01L 21/44; H01L 21/46; G06F 17/50
(52) U.S. Cl. .......... 438/15; 438/14; 438/107; 438/112; 438/127; 438/460; 716/4; 716/5
(58) Field of Search .......... 438/15, 14, 107, 438/112, 124, 126, 127, 460; 716/4, 5

(56) References Cited

U.S. PATENT DOCUMENTS

| 3,810,301 A | * | 5/1974 | Cook ......... 29/593 |
| 4,811,326 A | * | 3/1989 | Gerber ......... 369/100 |
| 4,855,984 A | * | 8/1989 | Gerber ......... 369/53.15 |

(List continued on next page.)

FOREIGN PATENT DOCUMENTS

| JP | 402235361 A | * | 9/1990 |
| JP | 403082046 A | * | 4/1991 |
| JP | 403132043 A | * | 6/1991 |
| JP | 403203257 A | * | 9/1991 |
| JP | 406275688 A | * | 9/1994 |

OTHER PUBLICATIONS

Takashi Ohzone, A study on hot–carrier–induced photoemission in n–MOSFET's under dynamic operation, ICMTS, pp. 75–80.*

Alexander E. Braun, Defect detection overcomes limitations, Semiconductor International, Newto, Feb. 1999, vol. 22, Issue 2, pp. 44–52.*

*Primary Examiner*—Matthew Smith
*Assistant Examiner*—Chuong Anh Luu
(74) *Attorney, Agent, or Firm*—Skjerven Morrill LLP

(57) ABSTRACT

A method is disclosed for manufacturing chip-scale semiconductor packages at a wafer-scale level using wafer mapping techniques. In the method, a semiconductor wafer and/or a circuit substrate, each respectively comprising a plurality of individual chips and circuit pattern units, is/are pre-tested and discriminated in terms of the quality and/or grade of each individual chip unit and/or circuit pattern unit contained therein. The test results are marked on the lower surface of each chip unit and/or on each pattern unit. The substrate is laminated to the wafer to form a laminated assembly prior to performing the packaging process, which typically includes a wire bonding step, an encapsulation step and a solder ball welding step. A plurality of connected package units are thereby formed in the laminated substrate-wafer assembly. The package units are then singulated from each other and the laminated assembly by a cutting process. Using the pre-testing results, the method eliminates wasteful packaging of defective chips. The quality and/or grade of packaged units are marked on the chips in accordance with the pre-testing data, thereby enabling defective packages to be distinguished from good packages without need for post-singulation testing. The method permits using only good circuit pattern units, thereby preventing expensive chip units from being packaged with defective pattern units. In addition, the method permits both a package pick-and-place step and a package marking step to be combined into a single operation using a single device.

37 Claims, 10 Drawing Sheets

U.S. PATENT DOCUMENTS

| | | | | |
|---|---|---|---|---|
| 4,985,988 A | * | 1/1991 | Littlebury | 29/827 |
| 5,151,388 A | * | 9/1992 | Bakhit et al. | 437/209 |
| 5,492,842 A | * | 2/1996 | Eytcheson et al. | 438/15 |
| 5,674,785 A | * | 10/1997 | Akram et al. | 438/15 |
| 5,838,951 A | | 11/1998 | Song | 395/500 |
| 5,852,870 A | * | 12/1998 | Freyman et al. | 29/841 |
| 5,897,334 A | * | 4/1999 | Ha et al. | 438/107 |
| 6,110,823 A | * | 8/2000 | Eldridge et al. | 438/660 |

* cited by examiner

FIG. 2

```
01^^^^^^^^^^3675074000743675010^^^^^^^^^^^950204^16^14^^5^13
^7400^74001CC^^^1^^^301114R^^^^2^^1041114R^^^^3^^^0^^^^^
^^^^4^^^0^^^^^^^^5^^^0^^^^^^^^^^^^^^^^^^^^^^^^^^^^^
^^^^^^^^^^^^^^^^^^^^^^^^^^^^^^^^^^^^^^^^^^^^^^^^^^^
^^^^....1111111Bu.......111C11111....u1C1C1112222Bu..C222C22
1222222.u222B221222C222uB22B2BB221C2222C22B22CB21222222CC22C
22B222212222.C22C122C222222C.22222CCC222122u.BC22122C222222.
.u22BCC2C22122u....A2CB2C2C22......uCB22B221u...
```

FIG. 3

```
Wf Map Revision Numb: 01
Container           :
Lot Number          : 3675074000
Wafer Number        : 743675010
Magnet Or Frame Numb:
Date Of Probing     : 950204
Size Of X Dim Of Map: 16
Size Of Y Dim Of Map: 14
X Cordin Of Alignmen: 5
Y Cordin Of Alignmen: 13
Step&Repeat Of X Dim: 7400
Step&Repeat Of Y Dim: 7400
Status              : ICC
ASCIIChar 1stSortCat: 1
Numb1stCat(GoodNumb):   30
Code ID Of 1st Categ: 1114R
Char, Count&Code#2#5: 2  1041114R   3  0        4  0        5  0
Miscellaneous Inform:

MapA[ 0]: ....1111111Bu...
MapA[ 1]: ....111C11111...
MapA[ 2]: .u1C1C1112222Bu.
MapA[ 3]: .C222C221222222.
MapA[ 4]: u222B221222C222u
MapA[ 5]: B22B2BB221C2222C
MapA[ 6]: 22B22CB21222222C
MapA[ 7]: C22C22B222212222
MapA[ 8]: .C22C122C222222C
MapA[ 9]: .22222CCC222122u
MapA[10]: .BC22122C222222.
MapA[11]: .u22BCC2C22122u.
MapA[12]: ...A2CB2C2C22...
MapA[13]: ...uCB22B221u...
```

FIG. 4

```
MpRvNmb[2+1]   : 01
CustmNm[10+1]  : AT&T
WfId[10+1]     : 743675010
LtId[10+1]     : 3675074000
FrId[11+1]     :
PrbDt[6+1]     : 950204
ArrXSz[2+1]    : 16
ArrYSz[2+1]    : 14
DieXsz[3+1]    : 291
DieYsz[3+1]    : 291
WfSize[1+1]    : 4
MpAngl[3+1]    : 0
RfXCdn[2+1]    : 5
RfYCdn[2+1]    : 1
CtgCnt[2+1]    : 7
Ctgry[MXBIN+1] : 12.BuCA
BCE_DT[MX_PK+1]: 12
Stts1[22+1]    : Stts:ICC   CdId:1114R      GDie:  30
Stts2[22+1]    : GDie:  30

....1111111Bu...
....111C11111...
.u1C1C1112222Bu.
.C222C221222222.
u222B221222C222u
B22B2BB221C2222C
22B22CB21222222C
C22C22B222212222
.C22C122C222222C
.22222CCC222122u
.BC22122C222222.
.u22BCC2C22122u.
...A2CB2C2C22...
...uCB22B221u...
```

WAFER-SCALE PRODUCTION OF CHIP-SCALE SEMICONDUCTOR PACKAGES USING WAFER MAPPING TECHNIQUES

BACKGROUND OF THE INVENTION

1. Field of the Invention

The present invention relates, in general, to a method of manufacturing semiconductor packages, and more particularly, to a method of manufacturing chip-scale semiconductor packages at a wafer scale level using wafer mapping techniques that results in both improved production efficiencies and higher package yields.

2. Description of the Related Art

In response to the recent trend of electronic equipment toward devices that are lighter, thinner, smaller, and more compact, such as communication systems and computers, it has become necessary to reduce the size of semiconductor packages used in such equipment to that approaching the size of a single semiconductor chip, while at the same time achieving high performance chip packages having "super" input/output pin densities. Such requirements are met in a semiconductor package known in the art as a "chip-size semiconductor package" or "chip-scale semiconductor package." In the following description, such packages are referred to as "chip-scale semiconductor packages" for ease of description.

FIG. 10 is a flowchart of a conventional method of manufacturing chip-scale semiconductor packages. As shown in the drawings, a wafer-shaped circuit substrate having a plurality of circuit pattern units in it is attached to a semiconductor wafer having a plurality of semiconductor chip units in it, with the substrate having a circuit pattern unit area of the same size and shape as that of the chip units in the wafer. This step is referred to as the "wafer lamination" step in the art.

After the wafer lamination step, a packaging process is performed on the laminated assembly. In a typical packaging process, a wire bonding step is first performed to electrically connect the semiconductor chip units of the wafer to corresponding ones of the circuit pattern units in the substrate. The wire bonding step is followed by an encapsulation step. In the encapsulation step, the wire-bonded parts are individually encapsulated within an envelope of an encapsulation material to form an encapsulated part that protects the wire-bonded parts from harmful environmental elements. Next, a solder ball welding step is performed in which a plurality of solder balls, which function as the signal and power input/output terminals of the packages, are welded to solder ball lands on the substrate.

A plurality of connected semiconductor package units are thereby formed in the laminated wafer-substrate assembly. After the above packaging process is complete, a "singulation" step is performed, in which the individual semiconductor package units of the wafer are "singulated," i.e., separated from each other and the assembly, typically by means of process in which the wafer-substrate laminated assembly is cut through along the periphery of each individual semiconductor package. It is usually necessary thereafter to perform a marking step in which the singulated package units are first tested, and then marked with their quality and/or grade. The marking step typically completes the semiconductor package manufacturing process.

However, the conventional method described above has certain drawbacks associated with it. In particular, the method involves attaching a wafer to a circuit substrate "blindly," i.e., without identifying defective chip units in the wafer and/or defective circuit pattern units in the substrate prior to effecting the packaging process. Therefore, the conventional method can result in a prodigal waste of expensive chips, circuit patterns, bonding wires, encapsulation materials, and solder balls, and needlessly consume expensive labor and time, in the completion of packages that are defective because of the presence of a defective chip and/or circuit pattern, thus resulting in low production yields and inefficient productivity.

Another problem experienced in the conventional method is the complexity caused by its need for a separate marking step in which the singulated package units are first tested at one station using a first piece of equipment, and then marked with quality and/or grade information at a second station and using a second piece of equipment.

Wafers can be tested and marked with quality and/or grade information in the form of, e.g., ink dots on each semiconductor chip unit before the wafers are subjected to the lamination step. However, this form of quality and/or grade marking is subsequently hidden from view by the circuit substrate during the lamination step, and it therefore becomes impossible to discriminate defective chip units from good units during the packaging process. Thus, even using marked wafers, the conventional method still results in inefficient waste of expensive bonding wires, encapsulation materials and solder balls and the needless consumption labor and time, thereby resulting in low production yields and efficiencies.

Additionally, in the conventional marking step, the individual semiconductor package units resulting from the singulation process are typically first placed on trays using a package "pick-and-place" device prior to being passed on to a separate marking device. The marking device marks product information, such as the product number, manufacturer, production date, and the like, in the form of alphanumeric characters on the lower surface of each package unit. In the case of chip-scale package units, the product information is marked on the lower surface of the chip of each package unit. Thus, the marking step in the conventional method necessitates two separate devices, each having a relatively complicated construction, one for picking and placing the packages on the trays prior to marking, and one for picking and placing the packages in designated attitudes and/or positions during the marking step. This separation of mechanical functions into two distinct operations and equipment also results in reduced production efficiency.

BRIEF SUMMARY OF THE INVENTION

The present invention has been made with the above problems of the prior art in mind, and accordingly, provides a method of manufacturing chip-scale semiconductor packages that eliminates the packaging of defective chip and/or circuit pattern units, thereby improving production efficiency and yield.

The present invention also provides a method of manufacturing chip-scale packages in which the quality and/or grade of package units is marked on the packages in accordance with wafer and/or substrate pre-testing data, and in which defective packages are easily discriminated from good packages without the need for testing after package singulation, even though defective chip units and/or circuit pattern units may have been incorporated into the packages intentionally, thereby improving production efficiency and yield.

The present invention also provides a method of manufacturing chip-scale packages in which only "good" circuit pattern units of a circuit substrate are used, while defective pattern units from the substrate are eliminated, thereby making it possible to avoid the packaging of expensive, "good" chip units with defective circuit pattern units, thereby improving package production efficiency and yield.

The present invention further provides a method of manufacturing chip-scale packages in which both the package pick-and-place step and the package marking step are combined in a single device, thus simplifying the manufacturing process and improving production efficiency.

BRIEF DESCRIPTION OF THE SEVERAL VIEWS OF THE DRAWINGS

The above and other features and advantages of the present invention will be more clearly understood from the following detailed description of several exemplary embodiments thereof, particularly if such description is considered in conjunction with the figures of the accompanying drawings, in which:

FIG. 2 depicts an array-type wafer map file;

FIG. 3 depicts a configuration file converted from the wafer map file of FIG. 2;

FIG. 4 depicts a standard file converted from the wafer map file of FIG. 2;

DETAILED DESCRIPTION OF THE INVENTION

This invention corresponds substantially to those disclosed in Korean Patent Application Nos. 98-35620, 98-35622, 98-35623, and 98-35624, all of which were filed on Aug. 31, 1998, and the disclosures of which are, by this reference, incorporated herein in their entireties.

Figure 1:
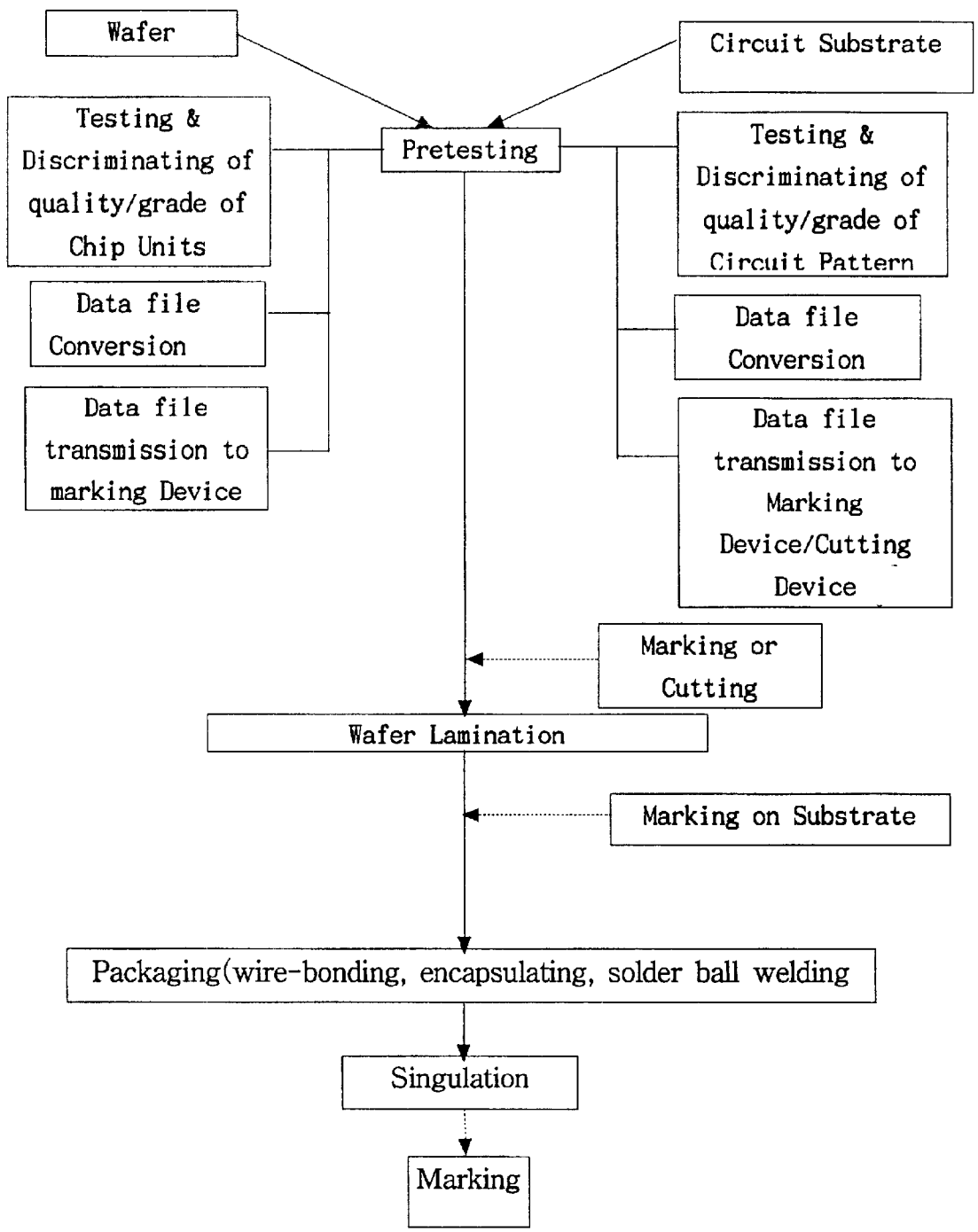
FIG. 1 is a flowchart of the method of manufacturing chip-scale semiconductor packages in accordance with the preferred embodiments of the present invention.

FIG. 1 is a flowchart of the method of manufacturing chip-scale semiconductor packages in accordance with this invention. The method according to a first preferred embodiment of this invention is described hereafter with reference to FIG. 1. The first embodiment of the method begins with the provision of a wafer having a plurality of semiconductor chip units in it, along with a circuit substrate having a plurality of circuit pattern units in it. The area of each circuit pattern unit in the substrate is the same size and shape as that of each chip unit in the wafer. The quality and/or grade of each chip unit of the wafer is then "pre-tested" and the test results are marked on the lower surface of each chip unit. A wafer lamination step is thereafter performed to attach the substrate to the wafer to form a laminated assembly.

After the wafer lamination step, a packaging process is performed on the assembly. In the packaging process, a wire bonding step is performed to electrically connect respective ones of the semiconductor chip units in the wafer to corresponding ones of the circuit pattern units in the substrate with a plurality of fine, conductive wires. The wire bonding step is followed by an encapsulation step. In the encapsulation step, the wire-bonded parts are individually packaged within a solid envelope of an encapsulation material to protect them from harmful environmental elements.

After the encapsulation step, a solder ball welding step is performed on the assembly, wherein a plurality of solder balls, comprising the signal input/output terminals of the packages, are welded to solder ball lands on the substrate, thereby forming a plurality of complete, connected semiconductor package units in the wafer-substrate assembly.

After the packaging process is complete, a singulation step is performed to singulate the individual semiconductor package units of the wafer-substrate assembly from the assembly by means of a cutting or sawing process.

Figure 6:
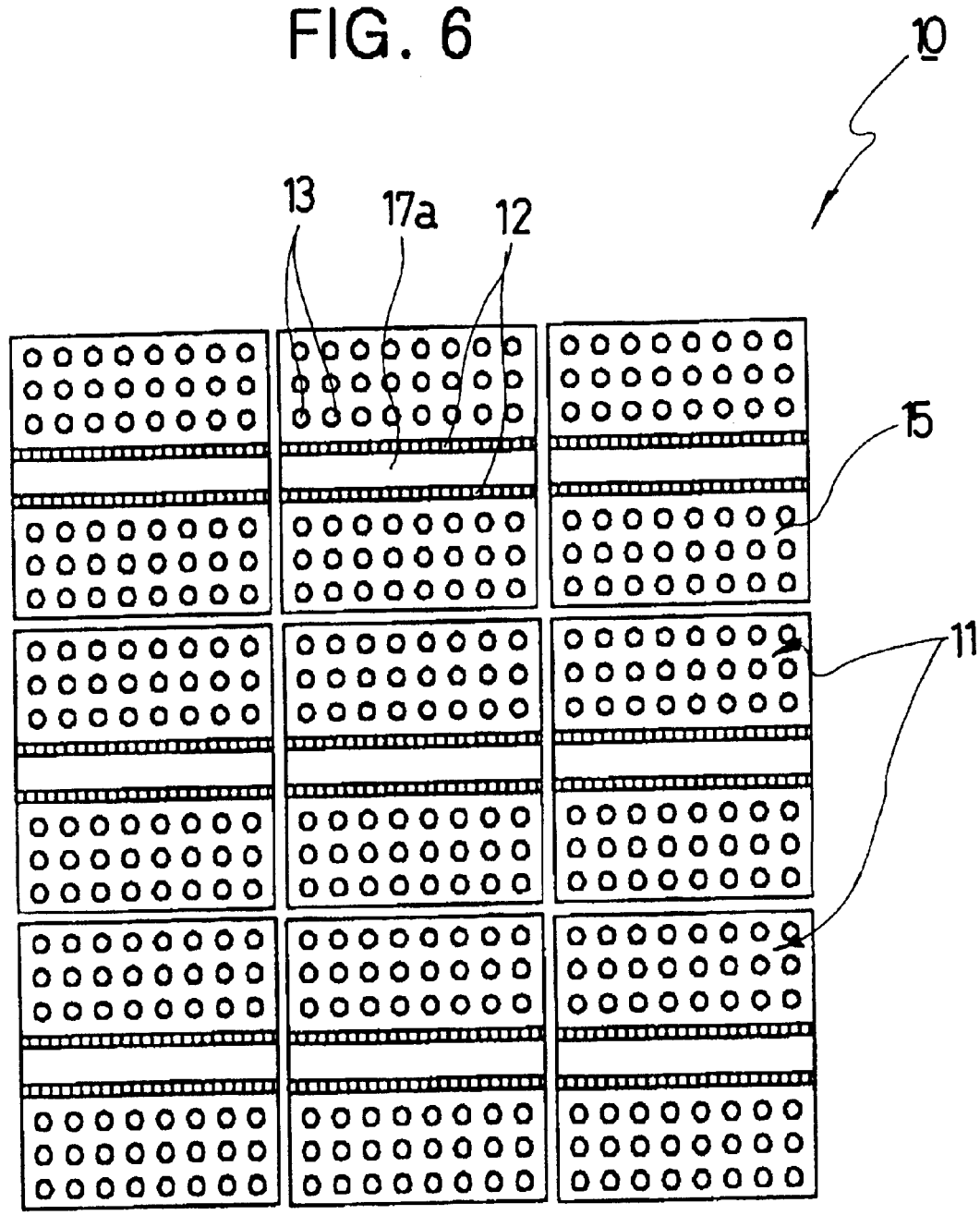
FIGS. 6 and 7 are plan views of alternative embodiments of a substrate provided with a plurality of circuit pattern units.
Figure 7:
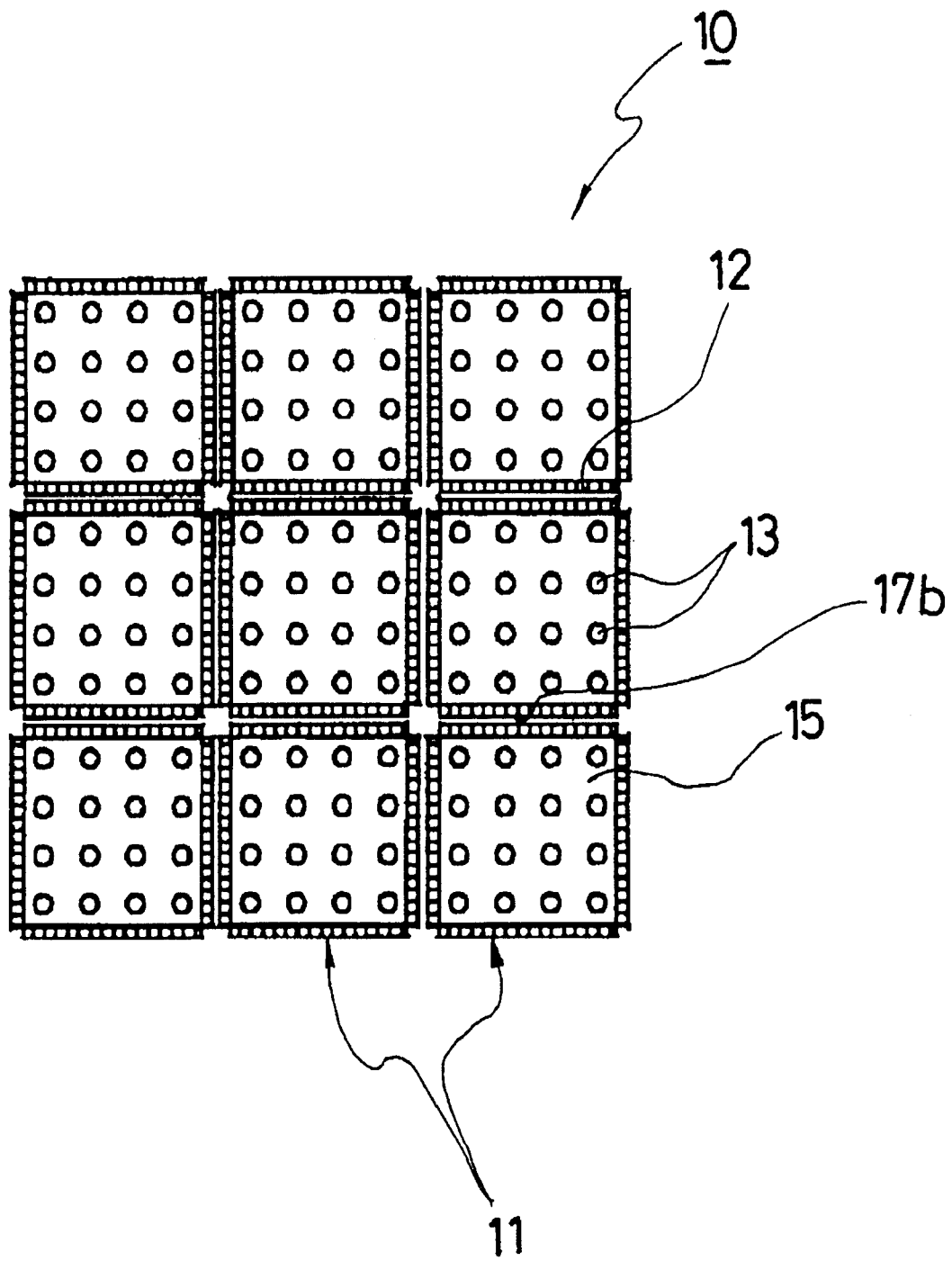

FIGS. 6 and 7 are plan views of alternative embodiments of a substrate, each provided with a plurality of circuit pattern units 11. As shown in the drawings, a strip-shaped central opening 17a, or a peripheral opening 17b, respectively, is formed in each circuit pattern unit 11 of the substrate 10, and the die bonding pads 41 (not shown in FIGS. 6 and 7) of each chip unit of the wafer are positioned within the openings 17a, 17b when each substrate 10 is attached to the top surface of its corresponding chip unit 40. Thus, in the rectangular embodiment of FIG. 6, a strip-shaped opening 17a is formed at the central portion of each circuit pattern unit 11 of the substrate 10. In the square embodiment of FIG. 7, four strip-shaped openings 17b are formed around the periphery of each square circuit pattern unit 11 of the substrate 10 to form a square profile. It should be understood, however, that in an embodiment alternative to that shown in FIG. 7, only two parallel, strip-shaped openings 17b may be formed on each circuit pattern unit 11 of the substrate 10.

A plurality of conductive wire bonding fingers 12 are formed along each longitudinal edge of the opening 17a, 17b, and are electrically connected to the die bonding pads 41 of an associated chip unit of the wafer using a plurality of fine, electrically conductive wires 50 (not shown in FIGS. 6 and 7). Each of the above bond fingers 12 is also electrically connected to a solder ball land 13 through a conductive trace (not shown in FIGS. 6 and 7). A solder ball 70 (not shown in FIGS. 6 and 7), comprising a signal input/output terminal of a finished package, is welded to each solder ball land 13 during a solder ball welding step.

A solder mask 15 may be formed on the top surface of the substrate 10 in such a way that the mask 15 generally covers the entire upper surface of the substrate 10, while selectively exposing both the bond fingers 12 and the solder ball lands 13 of the circuit pattern units through openings in it. The solder mask 15 serves to prevent accidental shorting between adjacent conductive traces by, e.g., stray solder tracks.

In the drawings, the reference numeral 18 denotes either a real or an imaginary singulation line on the substrate 10, along which the connected package units are singulated from each other and the wafer-substrate assembly after the packaging process is complete.

Figure 8:
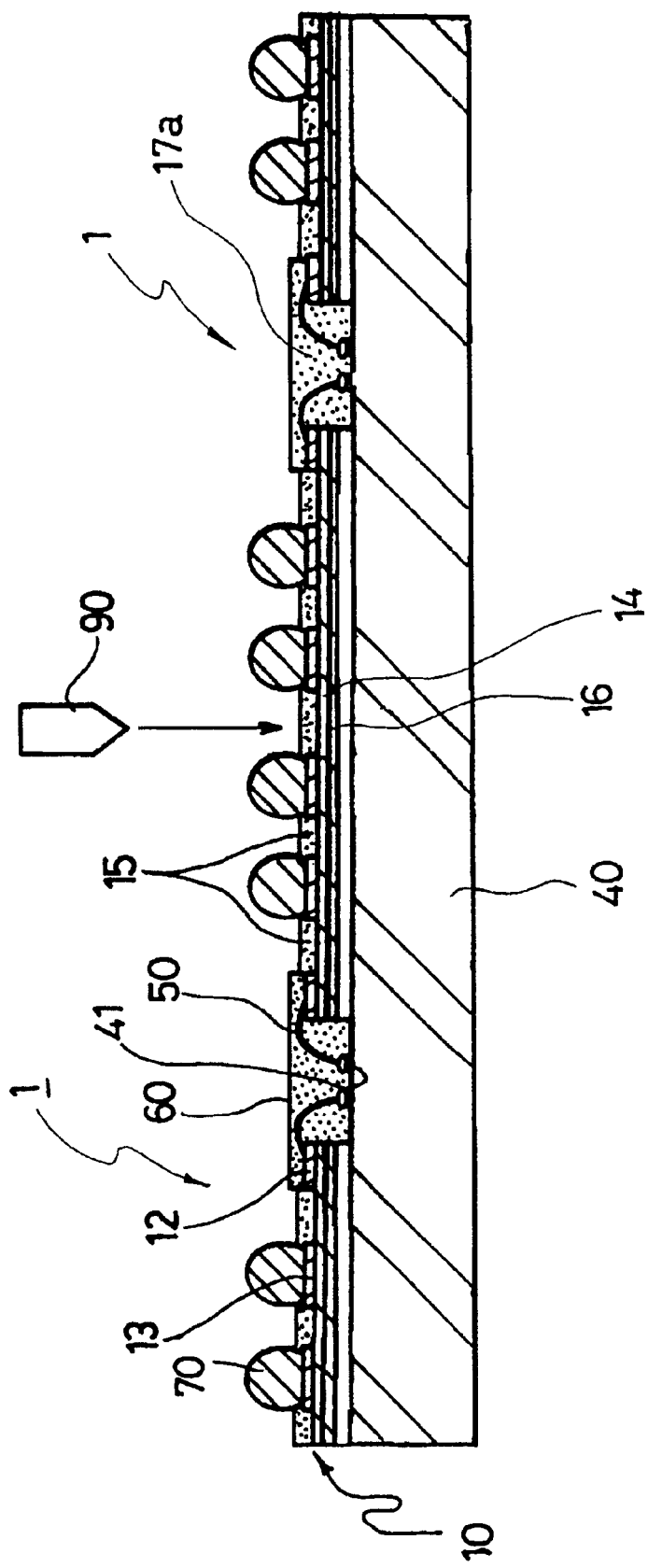
FIGS. 8 and 9 are sectional views showing the construction of alternative embodiments of a plurality of semiconductor package units produced by the method of this invention; and, FIG. 10 is a flowchart of a conventional method of manufacturing chip-scale semiconductor packages.
Figure 9:
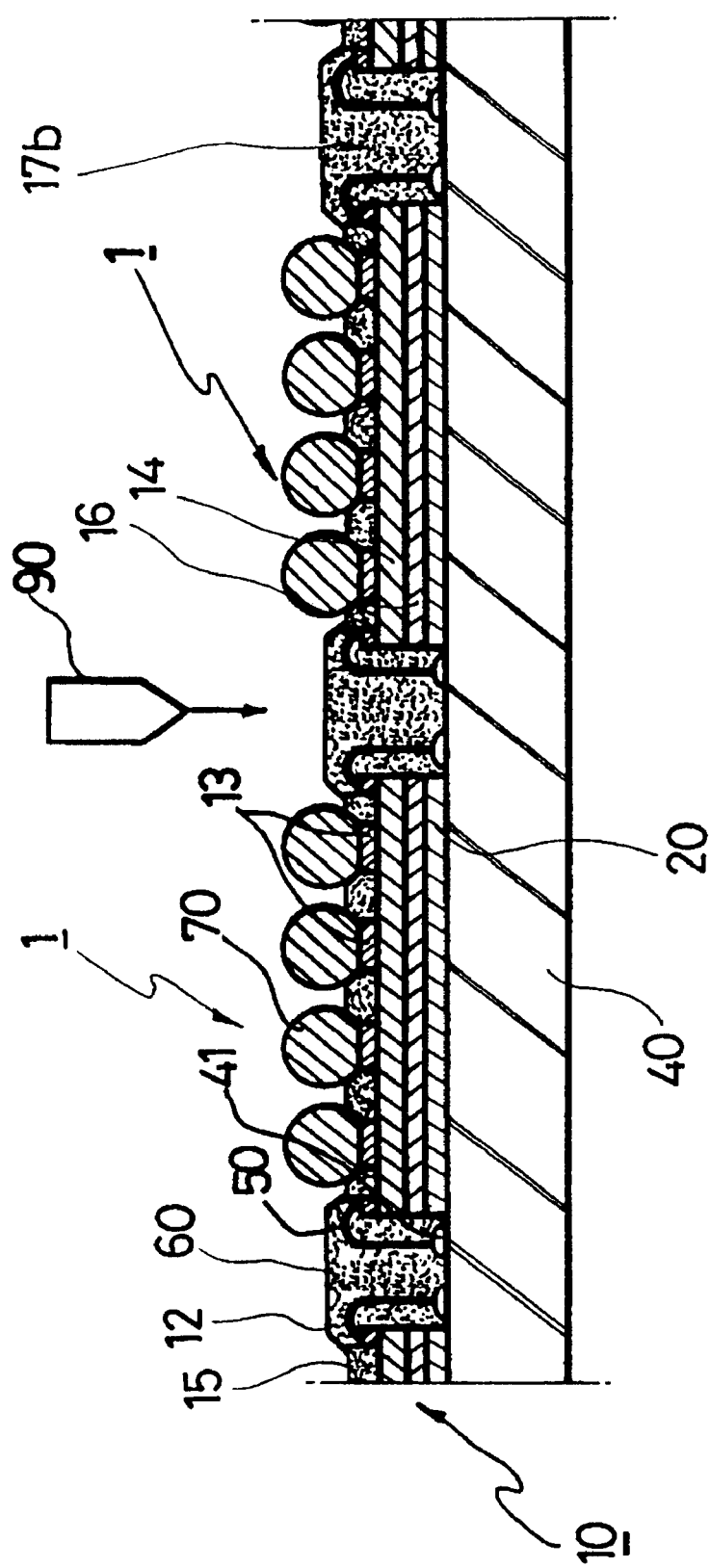
Figure 10:
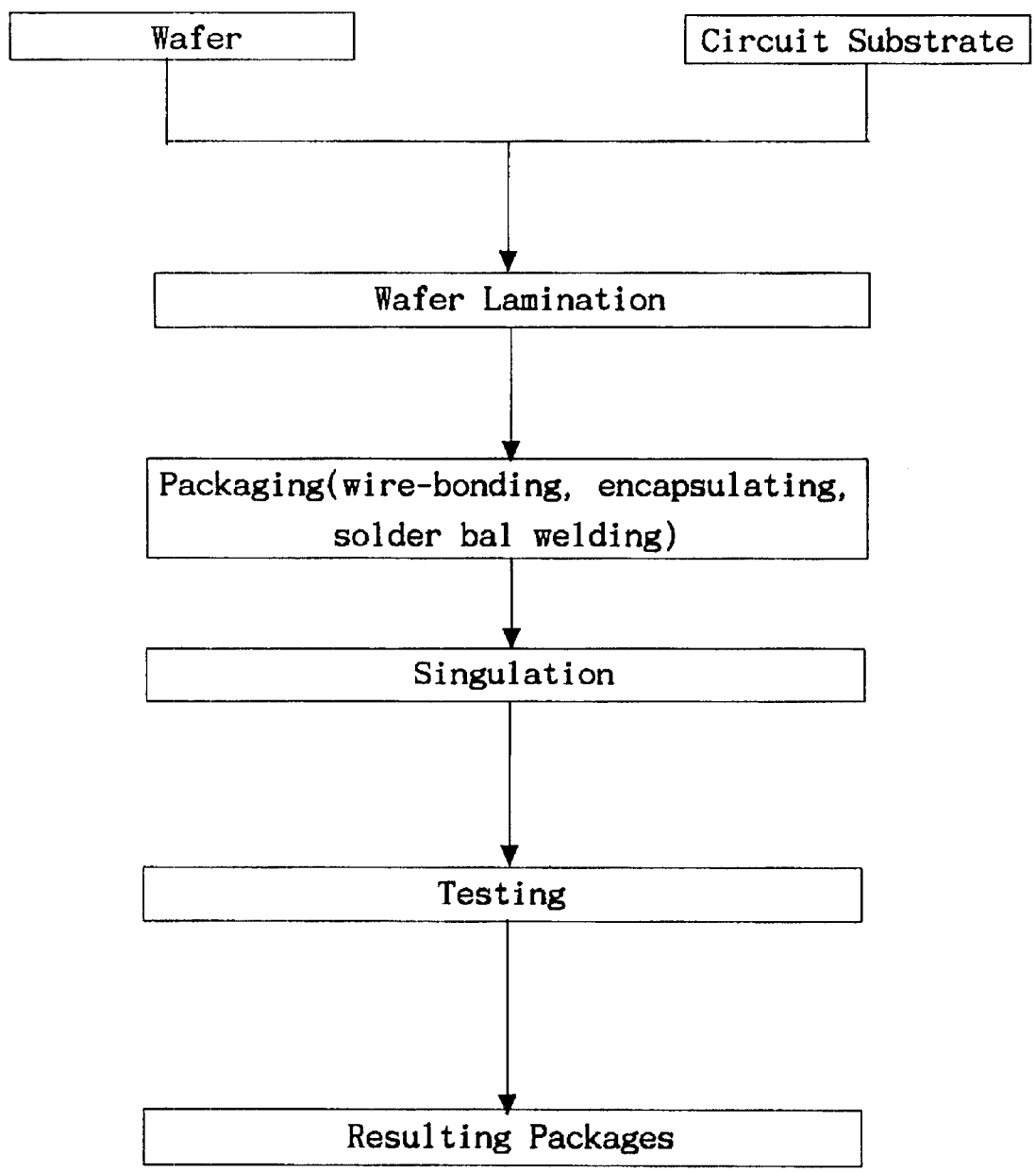

In the exemplary preferred embodiments of FIGS. 6 and 7, the layer structure of the substrate 10 comprises a plurality of identical, individual circuit pattern units 11, each of which has a plurality of conductive traces, with a bond finger 12 and a solder ball land 13 provided at opposite ends of each trace, formed on the upper surface of an insulating layer 14, and optionally, overlain with a solder mask 15 as described above. However, it should be understood that the structure of the substrate 10 may be advantageously modified without affecting the function of this invention. For example, as shown in FIGS. 8 and 9, a hard, "core layer" 16, such as a thin layer of metal, e.g., copper or a copper alloy, a glass/epoxy layer, or a ceramic layer, may be formed on the lower surface of the insulating layer 14. Alternatively, the hard core layer 16 can replace the flexible insulating layer 14 altogether. In one embodiment of the present invention, the insulating layer 14 preferably comprises a thin, polyimide resin "tape."

FIGS. 8 and 9 are cross-sectional elevation views showing the construction of two alternative embodiments of semiconductor packages 1 produced by the method of this invention. These drawings show the packages 1 at the stage at which they are still connected to each other, i.e., before singulation. The package 1 of FIG. 8 is produced using the substrate 10 shown in FIG. 6, while the package 1 of FIG. 9 is produced using the substrate 10 shown in FIG. 7.

As shown in the drawings, each semiconductor package 1 of this invention comprises a semiconductor chip 40 having a plurality of bonding pads 41 on it. A circuit substrate 10 is attached to the upper surface of the chip 40 by an adhesive layer 20. A plurality of fine conductive wires 50, made of gold or aluminum, electrically connect the bonding pads 41 on the chips 40 to the bond fingers 12 on the substrate 10. In order to protect the bond fingers 12, the die bonding pads 41, and the bonding wires 50 from harmful environmental elements, each of the openings 17a, 17b of the substrate 10, along with the associated bond fingers 12, the die bonding pads 41, the bonding wires 50, and the adjacent, exposed surface of the chip 40 are individually encapsulated using an encapsulation material, such as an epoxy resin, thereby forming an encapsulated part 60. A solder ball 70 is welded to each of the solder ball lands 13, each of which is exposed through an opening in the solder mask 15 on the substrate 10. The solder balls 70 function as the signal and power input/output terminals of the package 1.

The height of the encapsulated part 60 formed at the openings 17a, 17b of the substrate 10 is controlled to be less than that of the solder balls 70. It should be understood that it is possible to form the encapsulated part 60 using either a closed-mold, epoxy resin transfer molding process, or by simply "writing," i.e., dispensing from the nozzle of a pressure applicator, a relatively "stiff" liquid epoxy resin onto the connection region such that it covers and envelops the entire connection region of the pads 41, the fingers 12, the bonding wires 50, and the exposed portion of the chip 40 adjacent to those elements.

During operation of the semiconductor package 1, a signal from the chip 40 is outputted from the die pads 41 and flows through the conductive wires 50, the bond fingers 12, the conductive traces, the solder ball lands 13, and the solder balls 70, in that order, prior to being transmitted to a mother board (not shown) to which the package 1 is mounted and electrically interconnected by means of the solder balls 70.

In the drawings, the reference numeral 90 denotes a cutting tool which singulates the wafer-substrate assembly, which has in it a plurality of such packages 1 connected to each other, into individual packages 1. The cutting tool 90 may comprise, e.g., a laser, a rotary knife, or a saw.

Referring to the flowchart of FIG. 1, the wafer pre-testing step of the method according to the first embodiment of this invention comprises three sub-steps: 1) a "discrimination" step; 2) a "file conversion" step; and, 3) a "data file transmission" step. In the discrimination step, either the quality, the grade, or both the quality and the grade, of the semiconductor chip units of a wafer are tested, and the chips are discriminated among in accordance with the result of that testing and some pre-defined quality and/or grade criteria. As used herein, the term "quality" is generally used to refer to a "bipolar" condition of the chip units, e.g., "good/defective," "pass/fail," "acceptable/unacceptable," and the like, whereas, the term "grade" generally refers to a ranking, or ordering among the chip units based upon their acceptability for some purposes and their unacceptability for other purposes. The latter term might be applied, for example, in the case of memory devices, which are often "graded" or classified in terms of their reliable operating speed, or it might refer to, e.g., the reliability of the device, or the environment within which it is capable of operating reliably, e.g., "military," "commercial," or "hobbyist" grades of such devices.

In the file conversion step, the wafer pre-testing and discrimination data pertaining to the quality and/or grade of the individual chips, along with information pertaining to the position of each chip unit within the wafer, are recorded, processed, and translated into a "conversion file," which contains data about the quality, grade and position of the chip units in accordance with the actual, two-dimensional profile of the chip units in the wafer. The data from the file conversion step is then transmitted to a device, e.g., a marking device, during the data file transmission step.

The discrimination step can be performed using electronic test equipment and methods in which a wafer test fixture containing a plurality of test probes is brought into contact with pads on a surface of the wafer and diagnostic test signals are input to and output from the individual chip units such that the units are all tested simultaneously while being still attached to one another in the wafer.

Alternatively, the discrimination step can be performed using optical testing means, such as a camera, either automatically, using advanced pattern recognition techniques, or manually, as performed by a human operator, and either case, independently of any chip unit quality and/or grade information tested and/or marked on the wafer by the wafer manufacturer, as is sometimes done in the industry. However, when the wafer manufacturer does provide suitable machine-readable media, such as a magnetic disk or a tape, on which is recorded data pertaining to the position, and quality and/or grade of the chip units tested by it in the form of a "wafer map file," the discrimination step can be performed by using a file reading means, such as a computer, that is capable of reading such a manufacturer-supplied wafer map file and then discriminating among the chips in accordance with the discrimination criteria pre-programmed therein.

Regardless of whether the discrimination step is performed by using electronic testing equipment, optical testing means, or by reading a manufacturer-supplied wafer map file with a suitable reader, the discrimination information from the step is converted, in a data file conversion step, into either a "configuration file" or a "standard file" that can be read and acted upon by, e.g., a human operator, a marking device, a wire bonding device, an encapsulation device, a cutting device, or a pick-and-place device.

Typically, wafer map files are classified into one of a number of file types, e.g., a row-type file, an array-type file, a cartesian-type file, and the like, in accordance with both the type of information contained in the file, and the arrangement of that information within the file. Such wafer map files are made by arranging the quality and/or grade information of the chip units tested by a wafer testing means, along with information relating to the two-dimensional position, or "profile," of the chip units in the wafer. FIG. 2 shows an example of an array-type wafer map file.

In the file conversion step, the information recorded in the wafer map file is processed to translate and record a variety of wafer information items, thereby enabling a particular type of device, such as a marking device, a pick-and-place device, a cutting device, an encapsulating device, and/or a wire bonding device, to read the information during the operation of such device and to respond operatively to the data read therefrom with respect to the individual chip units. The file conversion step includes translating the quality, grade and positional information of the chip units into a file that contains data about the quality, grade and position of the chip units in accordance with the actual physical location of the chip units in the wafer, in a form that can be read and understood by the affected device. The conversion file may be a "configuration file" or a "standard file."

A configuration file is formed by a straightforward translation of the variety of information items of a wafer map file into a file readable by a specific device. A standard file, on the other hand, is formed by translating the information items of the wafer map file while simultaneously arranging the items in the form of a particular, predetermined style and form of file that is "standardized" within the industry. In the present invention, either the configuration file or the standard file may be selectively used as a conversion file as desired. FIG. 3 shows a configuration file converted from the wafer map file of FIG. 2. FIG. 4 shows a standard file converted from the wafer map file of FIG. 2.

Figure 5:
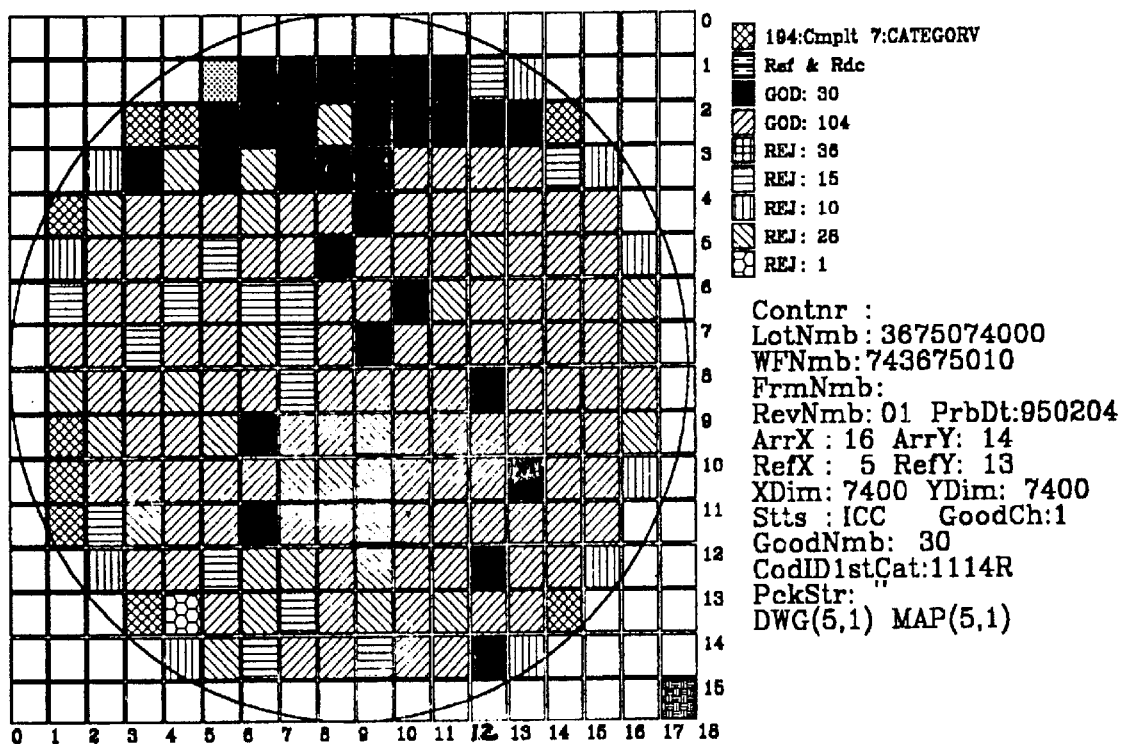
FIG. 5 depicts a working-model diagram translated from the wafer map file of FIG. 2.

The grade and position of the chip units in accordance with the actual two-dimensional profile of the wafer are presented on one side of the conversion file, while individual chip unit data and other information about the wafer are presented on the other side of the conversion file, thereby defining a "working model" diagram. FIG. 5 shows a working model diagram translated from the wafer map file of FIG. 2.

A detailed description of the nature, derivation, contents, and arrangement of a wafer map file, a configuration file, a standard file, and a working model diagram may be found in U.S. Pat. No. 5,838,951, which is owned by the owners of this invention, and the teachings of which are, by this reference, incorporated herein in their entireties.

In the marking step, a marking device reads the converted data transmitted to it and appropriately marks the information regarding the quality and/or grade of each chip unit on the lower surface of the corresponding chip unit. In the marking step, appropriate numerals, symbols, letters, and/or bar codes are marked on the lower surface of the chip units using conventional marking means, such as a laser marker, an ink dot marker, or a bar code marker.

Thus, according to the first preferred embodiment of this invention, the manufacturing steps implemented after the pre-testing step are performed with the quality and/or grade of the chip units in the wafer marked on the lower surface of the respective individual chip units. It is therefore easily possible, by visual reference to such markings, or by "electronic reference" to the data file used to create the markings, to omit placing a circuit pattern unit on a defective chip unit, or performing any of the individual packaging processes on any corresponding pair of chip and circuit pattern units that contains a defective chip unit, thereby preventing wasted labor and materials and improving packaging efficiency.

In addition, the need to perform a separate testing of the semiconductor packages after singulation is eliminated, and the singulated packages are easily classified or graded, again, either visually by reference to the markings on the lower surface of the packages, or electronically, by reference to the pre-testing data file, in accordance with their individual quality and/or grade.

It will be understood by those skilled in the semiconductor packaging art that, by interchanging a "flip-chip" interconnection process with the wire bonding process described above, the method of the embodiments of this invention described above and below may be used effectively for manufacturing semiconductor packages in which either the upper or the lower surface of the chip of each package is exposed to the outside of the package. In this alternative method, the surface of the substrate containing a plurality of pads for making electrical connections to the chips is placed facing down onto and in registration with the surface of the wafer containing a plurality of corresponding pads for connecting to the substrate, and a ball or thin layer of solder is interposed between corresponding ones of the respective pads.

The assembly is then placed in an oven and heated to the melting temperature of the solder, causing the solder to "re-flow" and fuse the pads in electrical connection with each other. A low viscosity encapsulant is then dispensed into each of a plurality of elongated openings through the substrate that extend around the periphery of each circuit pattern, where it is drawn by capillary action into the thin space (typically, 4–7 mils) between the substrate and the wafer, thereby serving both to laminate the substrate to the wafer, and to seal the upper, "active" surface of the wafer against moisture and other harmful elements in the environment.

In such an embodiment, the input/output solder balls 70 of the packages are attached to the lands 13 on the inward-facing surface of the substrate through openings in the substrate, or alternatively, to lands 13 formed on the outward-facing surface of the substrate, before singulation of the packages.

Thus, although only wire-bonded embodiments of chip scale semiconductor packages are described and illustrated herein, it should be understood that the methods of this invention are equally and advantageously applicable to flip-chip connected chip scale packages, as well.

The method of manufacturing semiconductor packages according to a second preferred embodiment of this invention is described below, again with reference to FIG. 1. In the second embodiment of the method, a wafer having a plurality of semiconductor chip units in it, and a circuit substrate having a plurality of corresponding circuit pattern units in it, are provided. As before, the circuit substrate has a circuit pattern unit area that is the same shape and size as that of the semiconductor chip units in the wafer. The quality and/or grade of each chip unit of the wafer, and/or the quality and/or grade of each circuit pattern unit of the substrate is/are pre-tested. A wafer lamination step is then performed to attach the wafer to the substrate in a laminated assembly.

A marking step, wherein the tested results are marked on each circuit pattern unit of the substrate, as opposed to the lower surface of the chip units, is performed, and this may be done either before or after the lamination step. Thereafter, a packaging process is performed as above. As in the first embodiment of the method, the packaging process includes a wire bonding step, an encapsulation step, a solder ball welding step, and a singulation step to separate the connected package units of the wafer-substrate assembly from each other.

The pre-testing step in the second embodiment of the method likewise comprises three sub-steps, a discrimination step, a file conversion step and a data file transmission step. In the discrimination step, the quality and/or grade of the semiconductor chip units and/or the quality and/or grade of the circuit pattern units is/are tested and discriminated. In the file conversion step, the discriminated results are processed to record a variety of wafer information and/or a variety of substrate information items and to translate the quality, grade and position information of the chip units and/or the quality, grade and position information of the circuit pattern units into a conversion file that records data about the quality, grade, and position of the elements in accordance with the two-dimensional profiles of the wafer and/or the substrate. The data from the file conversion step is then transmitted to a marking device during the data file transmission step.

As before, the wafer discrimination step may be performed using an electronic testing means, a visual testing means, or, if the wafer manufacturer provides a suitable wafer map file, the discrimination step may be performed simply by using a suitable file reading means for reading that file, in the same manner as that described above for the first embodiment.

Thus, it may be seen that the wafer pre-testing process according to the second embodiment of the invention is substantially the same as that described above for the first embodiment.

In addition, or alternatively, to pre-testing the wafer, it is also possible to test the quality and/or the grade of the circuit pattern units of the substrate, using either electronic or visual testing means, to determine, for example, whether any pattern unit has, e.g., a short circuit, an open circuit, or an omitted, misplaced, or defective circuit element, such as a bonding pad, prior to marking the defective circuit pattern units. It is more conventional to discriminate among circuit pattern units in terms of their quality, i.e., "good or bad," and not their grade, because, as a general rule, circuit pattern units are relatively less inexpensive than their corresponding semiconductor chip units. However, this is not always the case, for example, as in the case of certain ceramic circuit pattern units used in high frequency applications, and it may thus be desirable to discriminate among circuit pattern units in terms of both their individual grade and quality, and to generate a substrate map file, configuration file, standard file and/or working model diagram analogous to those generated for the wafer during the wafer pre-testing step.

In such a case, both the defective circuit pattern units of the substrate, as well as "good" circuit pattern units corresponding to defective chip units, are appropriately marked on the substrate.

As mentioned above, the marking step, wherein the test results of the wafer and/or the substrate pre-testing are marked on the outward-facing surface of each circuit pattern unit of the substrate, can be performed either before, or after, the wafer lamination step.

When the marking step is performed before the wafer lamination step, and where the defective chip units have already been marked by the wafer manufacturer using conventional marking means, such as an ink dot marker, the marks on the chip units are read off by a visual inspection technique prior to forming the marks on the circuit pattern units of the substrate that correspond to the defective chip units. It is thereby easily possible to place appropriately marked circuit pattern units of the substrate on the defective chip units of the wafer during the subsequent wafer lamination step. In this case, a laser marker, an ink dot marker, a bar code marker, or a punch, is preferably employed as the circuit pattern marking means. In addition, the marking position on each circuit pattern unit should be selected so that the marks are not obscured during any subsequent manufacturing steps. It is thus more preferable to form the marks at a "fiducial" marking position on each circuit pattern unit, i.e., one selected to be distinguishable by a reading device during subsequent manufacturing steps. However, except for this, it should be understood that the marking position on each circuit pattern unit is not otherwise limited, but may be selected anywhere on the surface on the circuit units, so long as the markings are not obscured or obliterated by any subsequent manufacturing steps, such as the wire bonding or the encapsulation steps.

Where the marking step is performed before the wafer lamination step, and where the wafer manufacturer has recorded and supplied a wafer map file of the quality and/or grade of the chip units as tested by the manufacturer, then the circuit pattern units of the substrate that correspond to the defective chip units are marked on the substrate in accordance with the information of the supplied wafer map file using conventional marking means. It is thus easily possible to ensure that the appropriately marked circuit pattern units of the substrate are accurately placed on the corresponding, defective chip units of the wafer during the subsequent wafer lamination step.

When the marking step is performed after the wafer lamination step, the marking process remains the same as that described above for the marking process performed before the lamination step, except that the marks are formed on the circuit pattern units of the substrate after the substrate has been attached to the wafer. However, it will be understood that, when the circuit pattern units are marked after the wafer lamination step, the markings cannot be made by a punching method, as this could easily damage the fragile, underlying semiconductor wafer.

In the second embodiment, the quality and/or grade of the semiconductor chip units of the wafer that correspond to defective chip units may be marked on the circuit pattern units of the substrate, and/or the separately tested quality and/or grade of the circuit pattern units may be marked on the pattern units. It is thereby possible to avoid performing any or all of the steps of the packaging process with respect to any defective circuit pattern units, thus improving both production efficiency and productivity.

In addition, it is unnecessary to perform a separate test of the semiconductor packages after singulation, even where defective circuit pattern units have intentionally been packaged along with good pattern units, as the singulated packages are easily classified visually according to their quality without such testing.

The method of manufacturing semiconductor packages according to a third exemplary embodiment of this invention is described hereafter, also with reference to FIG. 1. The method of the third embodiment, as in the first and second embodiments described above, starts with the provision of a semiconductor wafer having a plurality of semiconductor chip units in it, and an associated circuit substrate having a plurality of corresponding circuit pattern units in it. Thereafter, the quality and/or grade of each chip unit of the wafer, and at least the quality of each circuit pattern unit of the substrate, are pre-tested and recorded in an appropriate configuration file, as described above.

A wafer lamination step is then performed to attach the circuit pattern units of the substrate to the wafer in a laminated wafer-substrate assembly. In the lamination step of the third embodiment, defective circuit pattern units may be removed from the substrate, e.g., by cutting or punching, prior to laminating the remaining good pattern units on at least the "good" chip units of the wafer. In such a case, additional good pattern units are then cut from another substrate and attached to the wafer at positions corresponding to the removed defective circuit pattern units.

Alternatively, good pattern units may be cut from the substrate in the form of one or more groups having a different number and/or shape of units than those left remaining in the substrate above prior to laminating them on at least the good chip units of the wafer. After the lamination step, a packaging process, identical to that performed in the first and second embodiments, is performed on the laminated assembly.

A marking step, wherein the pre-test results are marked on the lower surface of the individual chip units of the wafer, or on the outward-facing individual circuit pattern units of the substrate, may be performed, either before or after the wafer lamination step.

As in the first and second embodiments described above, both the wafer and the substrate pre-testing steps of the third embodiment of the method of this invention comprise three sub-steps, a discrimination step, a file conversion step, and a data file transmission step. In the discrimination step, the individual chip units and the individual circuit pattern units are tested and discriminated among in terms of their individual quality and/or grade. In the file conversion step, the discriminated results are converted, or translated, into a conversion file. The data from the file conversion step is then transmitted to a substrate cutting device during the data file transmission step. That is, the pre-testing process remains the same as that described for the first two embodiments described above, except that the data from the file conversion step is transmitted to a substrate cutting device, in addition to the marking device, during the data file transmission step.

In the third embodiment of the method, the lamination step may be performed through either of two alternative processes, described below. In addition, the circuit pattern units of the substrate may be cut into separate units using, e.g., a punch, a laser, a rotary knife, or a saw, each of which may be controlled in accordance with the wafer and substrate pre-testing results, in the manner described below.

In the first of the two alternative lamination processes, a first lamination step is performed, wherein defective circuit pattern units are first removed from the substrate prior to laminating the remaining good pattern units on the wafer. The first lamination step is followed by a second lamination step wherein additional good pattern units are cut from one or more additional substrates and attached to the wafer at positions corresponding to those of the defective pattern units that were removed from the substrate in the first lamination step. It should be understood, however, that in the first alternative process, it is possible to omit attaching good circuit pattern units to the wafer at positions corresponding to known defective chip units without affecting the function of the invention. Likewise, where the quality and/or grade of the underlying chip units is known prior to lamination, it is also possible to omit as unnecessary the removal of defective circuit pattern units that correspond to known bad chips.

In the second of the two alternative lamination processes, good pattern units are cut from the substrate in the form of one or more groups corresponding to at least the good chip units of the wafer and laminated thereon. It should be understood that, in the second alternative process, the step of attaching circuit pattern units to defective chip units of the wafer can be omitted without affecting the function of this invention. In this alternative process, the number of groups of the good pattern units cut from the substrate and the shape of the groups are not limited, so long as they are all known to include only good pattern units.

Thus, it will be seen that the third embodiment of the method of this invention involves using only good circuit pattern units, and eliminating all defective circuit pattern units, from the substrate, thereby preventing the assembly of relatively expensive, good chip units with relatively inexpensive defective circuit pattern units. And, as in the embodiments described above, even if good circuit pattern units are intentionally laminated to known defective chip units, it is still easy to omit performing the additional manufacturing steps of wire bonding, encapsulation, and solder ball welding on the units containing a defective chip. This embodiment of the method thus also provides improved production efficiency and package yield.

The method of manufacturing chip-scale packages according to a fourth embodiment of this invention is described hereinbelow with reference to FIG. 1. As in the previously-described embodiments, the fourth embodiment begins with the provision of a wafer having a plurality of semiconductor chip units in it, along with an associated substrate having a plurality of corresponding circuit pattern units in it. The quality and/or grade of each chip unit of the wafer, and/or the quality and/or grade of each pattern unit in the substrate, is/are pre-tested, and the results of the pre-testing are recorded in appropriate map files. A wafer lamination step is then performed to attach the circuit pattern units of the substrate to the wafer. After the lamination step, a packaging process identical to that performed in the first, second, and third embodiments of the invention, is performed on the laminated assembly.

After package singulation, an inspection of the packages is made to determine whether any singulated package requires any "reprocessing," typically involving the replacement or re-welding of missing, defective, or defectively attached solder balls. "Good" packages requiring reprocessing, i.e., those including a good circuit pattern and/or a good chip unit, are first removed from the singulated batch of packages for that purpose.

The results of the wafer and/or the substrate pre-testing are then marked on the remaining packages. In this embodiment of the method, the package inspection, sorting and marking are preferably performed during a single operation and using a single device.

The method according to the fourth embodiment may be performed through either of two slightly different alternative processes, as described below.

In the first of the two alternative processes, "good" packages not requiring re-processing, i.e., packages incorporating either a good chip unit, a good circuit pattern unit, or both, are picked out from the singulated packages in accordance with the wafer and/or substrate pre-testing data. In this variation, the package inspection step is performed on all of the packages prior to turning the packages over, i.e., with the lower surface of the semiconductor chip facing upwardly, and that surface of the packages is then marked with the pre-testing results. Thereafter, the good packages and the defective packages, i.e., those containing at least one of a defective chip and a defective circuit pattern, are sorted into two separate groups and seated on two respective trays by the pick-and-place apparatus, in accordance with the wafer and/or the substrate pre-testing data.

In the second alternative process, "good" packages, i.e., incorporating at least one of a good chip unit and a good circuit pattern unit, are picked out from the singulated packages in accordance with the wafer and/or pre-testing data. In addition, the reprocessing inspection is performed on all the packages before they are sorted into groups of good packages and defective packages on separate trays. Thereafter, the good packages are turned over by pick-and-place apparatus, so that the lower surface of the semiconductor chip faces upwardly, and that surface is then marked with the results of the wafer and/or substrate pre-testing results.

In either variation of the fourth embodiment of the method, however, the marking device may comprise a package pick-and-place unit for picking out the singulated packages, a package turning unit for turning the picked packages over, and a marking unit for marking the packages, in addition to the plurality of trays for seating the marked packages thereon. That is, this embodiment of the invention permits a conventional package marking device to combined with a conventional pick-and-place-and-turn device, thus reducing the required number of separate package processing steps and devices, thereby improving package productivity.

Although certain particular embodiments of the method of the present invention have been described and illustrated herein for exemplary purposes, those skilled in the art will appreciate that various modifications, additions and substitutions can be made to the method without departing from the scope and spirit of the invention. Therefore, the embodiments of the invention illustrated and described herein should be taken as exemplary in nature only, and not by way of any limitation on the scope of this invention, which is defined by that of the claims appended hereafter.

What is claimed is:

1. A method of manufacturing chip-scale semiconductor packages, comprising:
   providing a semiconductor wafer having a plurality of semiconductor chip units arranged in a two-dimensional profile therein;
   providing a circuit substrate having a plurality of circuit pattern units arranged in a two-dimensional profile therein;
   pre-testing at least one of the wafer and the substrate to determine at least one of the quality and the grade of the chip units in the wafer and the circuit pattern units in the substrate and recording results of the pre-testing in at least one data file;
   marking the results of the pre-testing on corresponding ones of at least one of the chip units in the wafer and the circuit pattern units in the substrate;
   after said pre-testing, laminating a selected portion of the substrate to a selected portion of the wafer to form a laminated assembly containing corresponding pairs of chip units and circuit pattern units;
   forming electrical connections between the chip unit and the corresponding circuit pattern unit in selected ones of the pairs in connection regions on the assembly;
   encapsulating selected ones of the connection regions with an encapsulant; and,
   singulating individual semiconductor package units from the laminated assembly.

2. The method according to claim 1, wherein pre-testing at least one of the wafer and the substrate to determine at least one of the quality and the grade of the chip units in the wafer and the circuit pattern units in the substrate comprises:
   discriminating among at least one of the chip units in the wafer and the circuit pattern units in the substrate in accordance with the pre-testing results and a pre-defined discrimination criterion; and,
   processing the results of the discrimination process, along with positional data relating to an associated one of the two-dimensional profiles of the chip units in the wafer and the circuit pattern units in the substrate to translate the discrimination results and the profile data into a conversion file containing data relating to the position and at least one of the quality and the grade of at least one of the chip units in the wafer and the circuit pattern units in the substrate.

3. The method according to claim 2, wherein discriminating among at least one of the chip units in the wafer and the circuit pattern units in the substrate is performed using optical testing means.

4. The method according to claim 2, wherein discriminating among the chip units in the wafer is performed using means capable of reading a wafer map file containing data relating to the position and at least one of the quality and the grade of the chip units in the wafer.

5. The method according to claim 2, further comprising:
   converting the conversion file into a configuration file or a standard file containing data relating to the position and at least one of the quality and the grade of at least one of the chip units in the wafer and the circuit pattern units in the substrate and capable of being read and acted upon by at least one of a marking device, a cutting device, a wire-bonding device, an encapsulation device, and a pick-and-place device.

6. The method according to claim 1, wherein the two-dimensional size and shape of the individual circuit pattern units in the substrate is the same as that of the corresponding individual chip units in the wafer.

7. The method according to claim 1, wherein at least one of the portions of the substrate and the wafer selected for lamination, and the corresponding pairs of chip units and circuit pattern units selected for electrical connection, the connection regions selected for encapsulation, is selected in accordance with the results of the pre-testing of at least one of the quality and the grade of at least one of the chip units in the wafer and the circuit pattern units in the substrate.

8. The method according to claim 1, wherein the results of the pre-testing of at least one of the wafer and the substrate are marked on corresponding ones of the circuit pattern units before the selected portion of the substrate is laminated to the selected portion of the wafer.

9. The method according to claim 1, wherein the results of the pre-testing of at least one of the wafer and the substrate are marked on corresponding ones of the circuit pattern units after the selected portion of the substrate is laminated to the selected portion of the wafer.

10. The method according to claim 1, wherein the results of the pre-testing of at least one of the wafer and the substrate are marked on corresponding ones of the circuit pattern units by means of a punch, a laser marker, a bar code marker, or an ink dot marker, and wherein the marking formed thereby is positioned on the circuit pattern units such that the marking is not obscured by a subsequent manufacturing process.

11. The method according to claim 1, wherein laminating a selected portion of the substrate to a selected portion of the wafer comprises:

removing circuit pattern units pre-tested as defective from a first substrate to leave only good circuit pattern units remaining therein;

laminating the remaining good pattern units to the wafer;

cutting additional pattern units pre-tested as good from a second substrate at positions corresponding to the positions of the defective pattern units removed from the first substrate; and, laminating the additional good pattern units to the wafer.

12. The method according to claim 1, wherein laminating a selected portion of the substrate to a selected portion of the wafer comprises:

removing circuit pattern units pre-tested as good from a first substrate to leave only defective circuit pattern units remaining therein;

laminating the good pattern units to the wafer;

cutting additional pattern units pre-tested as good from a second substrate in a number and a pattern corresponding to the number and pattern of chip units in the wafer pre-tested as good and which remain uncovered by a circuit pattern; and, laminating the additional good pattern units to the wafer at positions corresponding to the positions of the good chip units remaining uncovered in the wafer.

13. The method according to claim 1, further comprising:

inspecting the singulated semiconductor packages to determine if any singulated package requires reprocessing; and, marking the results of the pre-testing of at least one of the wafer and the substrate on corresponding ones the packages during the inspection.

14. The method according to claim 13, wherein inspecting the singulated packages further comprises:

picking out packages containing at least one of a good chip unit and a good circuit pattern unit from the singulated packages in accordance with the results of the pre-testing of at least one of the wafer and the substrate;

inspecting the picked-out packages to determine if any of them requires reprocessing;

inverting the picked-out packages such that the lower surface of the chip in each package is facing up;

marking the results of the pre-testing of at least one of the wafer and the substrate on the upward-facing surface of the chip; and, sorting the picked-out packages and packages containing at least one of a defective chip unit and a defective circuit pattern unit onto separate trays.

15. The method according to claim 13, wherein inspecting the singulated packages further comprises:

picking out packages containing at least one of a good chip unit and a good circuit pattern unit from the singulated packages in accordance with the pre-testing of at least one of the wafer and the substrate;

inspecting the picked-out packages to determine if any them requires reprocessing;

sorting the picked out packages and packages containing at least one of a defective chip unit and a defective circuit pattern unit onto separate trays;

inverting the picked-out packages such that the lower surface of the chip in each package is facing up; and, marking the results of the pre-testing of at least one of the wafer and the substrate on the upward-facing surface of the chip.

16. A method of manufacturing a plurality of chip-scale semiconductor packages, the method comprising:

providing a semiconductor wafer having a plurality of semiconductor dies arranged in a two-dimensional array therein;

providing a circuit substrate having a plurality of circuit pattern units arranged in a two-dimensional array corresponding to the two-dimensional array of the dies in the wafer;

testing at least one of the wafer and the substrate before lamination thereof to determine at least one of the quality and the grade of at least one of the dies in the wafer and the circuit pattern units in the substrate and recording results of the pre-lamination testing in at least one data file;

laminating the substrate to the wafer to form a laminated assembly containing pairs of corresponding dies and circuit pattern units;

forming electrical connections between corresponding dies and circuit pattern units in respective pairs thereof; and, singulating individual semiconductor package units from the laminated assembly.

17. The method of claim 16, wherein the pre-lamination testing comprises testing at least one of the quality and the grade of the dies in the wafer.

18. The method of claim 16, wherein the pre-lamination testing comprises testing at least one of the quality and the grade of the circuit pattern units in the substrate.

19. The method of claim 16, wherein laminating the substrate to the wafer comprises selecting at least a portion of at least one of the substrate and the wafer for lamination to a corresponding portion of the other in accordance with the results of the pre-lamination testing.

20. The method of claim 19, wherein selecting at least a portion of at least one of the substrate and the wafer for lamination to a corresponding portion of the other comprises:

removing defective circuit pattern units from a first substrate to leave only good circuit pattern units remaining therein;

laminating the good pattern units remaining in the first substrate to the wafer;

cutting additional good pattern units from a second substrate at positions corresponding to the positions of the defective pattern units removed from the first substrate; and, laminating the additional good pattern units to the wafer.

21. The method of claim 19, wherein selecting at least a portion of at least one of the substrate and the wafer for lamination to a corresponding portion of the other comprises:

removing good circuit pattern units from a first substrate to leave only defective circuit pattern units remaining therein;

laminating the removed good pattern units to the wafer;

cutting additional good pattern units from a second substrate in a number and a pattern corresponding to the number and pattern of good dies in the wafer remaining uncovered by a circuit pattern; and, laminating the additional good pattern units to the wafer at positions corresponding to the positions of the good chip units remaining uncovered in the wafer.

22. The method of claim 16, wherein forming electrical connections comprises selecting the respective pairs of corresponding dies and circuit pattern units to be electrically connected in accordance with the results of the pre-lamination testing.

23. The method of claim 16, further comprising marking the results of the pre-lamination testing on at least one of the corresponding dies and the circuit pattern units in respective pairs thereof.

24. The method of claim 16, wherein the pre-testing comprises:
   discriminating among at least one of the dies in the wafer and the circuit pattern units in the substrate in accordance with the pre-lamination testing results and a pre-defined discrimination criterion; and,
   processing the results of the discrimination process, together with positional data relating to an associated one of the two-dimensional arrays of the chip units in the wafer and the circuit pattern units in the substrate to translate the discrimination results and the positional data into a conversion file containing data correlating the position and at least one of the quality and the grade of at least one of the dies in the wafer and the circuit pattern units in the substrate.

25. The method of claim 24, further comprising converting the conversion file into one of a configuration file and a standard file containing data correlating the position and at least one of the quality and the grade of at least one of the dies in the wafer and the circuit pattern units in the substrate and capable of being read and acted upon by at least one of a marking device, a cutting device, a wire-bonding device, an encapsulation device, and a pick-and-place device.

26. The method of claim 16, wherein the dies of the wafer are tested in said pre-lamination testing, and further comprising placing a mark on an inactive surface of the at least some of the dies indicative of a result of the testing.

27. The method of claim 16, wherein the circuit pattern units are tested in said pre-lamination testing, and further comprising placing a mark on at least some of the circuit pattern units indicative of a result of the testing.

28. The method of claim 16, wherein the circuit pattern units are tested in said pre-lamination testing, and only circuit pattern units quality tested as good are laminated to respective dies of the wafer.

29. The method of claim 16, wherein the circuit pattern units are tested in said pre-lamination testing, and only circuit pattern units quality tested as good have said electrical connections formed therewith.

30. The method of claim 16, wherein the dies of the wafer are tested in said pre-lamination testing, and only dies quality tested as good have said electrical connections formed therewith.

31. The method of claim 16, wherein both the dies of the wafer and the circuit pattern units are tested in said pre-lamination testing.

32. A method of manufacturing a plurality of chip-scale semiconductor packages, the method comprising:
   providing a semiconductor wafer having a plurality of semiconductor dies arranged in a two-dimensional array therein;
   providing a circuit substrate having a plurality of circuit pattern units arranged in a two-dimensional array corresponding to the two-dimensional array of the dies in the wafer;
   testing each of the wafer and the substrate before lamination to the other to determine at least one of the quality and the grade of the dies in the wafer and the circuit pattern units in the substrate and recording results of the testing;
   laminating a selected portion of the tested substrate to a corresponding portion of the tested wafer to form a laminated assembly containing pairs of corresponding dies and circuit pattern units;
   electrically connecting corresponding dies and circuit pattern units to each other in selected pairs thereof;
   encapsulating selected ones of the electrical connections with an encapsulant; and,
   singulating individual semiconductor package units from the laminated assembly.

33. The method of claim 32, wherein at least one of the portion of the substrate selected for lamination to the wafer, the pairs of corresponding dies and circuit pattern units selected for electrical connection to each other, and the electrical connections selected for encapsulation, are selected in accordance with the results of the pre-lamination testing.

34. The method of claim 32, further comprising converting the results of the pre-lamination testing into a file capable of being read and responsively acted upon by at least one of a marking device, a cutting device, a wire-bonding device, an encapsulating device, and a pick-and-place device.

35. The method of claim 32, further comprising:
   selecting singulated packages containing both good dies and good circuit pattern units in accordance with the results of the testing;
   inspecting the packages selected to determine if any requires re-processing; and,
   sorting the inspected packages requiring re-processing into a first group.

36. The method of claim 32, further comprising welding input/output terminals to lands on selected ones of the circuit pattern units in the substrate.

37. The method of claim 36, wherein the input/output terminals are welded to lands on circuit pattern units selected in accordance with the results of the pre-lamination testing.

* * * * *